United States Patent
Yang

(10) Patent No.: US 7,681,779 B2
(45) Date of Patent: Mar. 23, 2010

(54) METHOD FOR MANUFACTURING ELECTRIC CONNECTIONS IN WAFER

(75) Inventor: Hsueh An Yang, Taipei (TW)

(73) Assignee: Advanced Semiconductor Engineering, Inc., Pingtung (TW)

( * ) Notice: Subject to any disclaimer, the term of this patent is extended or adjusted under 35 U.S.C. 154(b) by 0 days.

(21) Appl. No.: 12/046,097

(22) Filed: Mar. 11, 2008

(65) Prior Publication Data

US 2008/0230587 A1    Sep. 25, 2008

(30) Foreign Application Priority Data

Mar. 21, 2007  (TW) .............................. 96109644 A

(51) Int. Cl.
*B23K 31/02*    (2006.01)
*H01L 21/44*    (2006.01)
(52) U.S. Cl. .................................. 228/248.1; 438/615
(58) Field of Classification Search .............. 228/248.1, 228/180.2, 121, 246, 161, 221, 227, 228
See application file for complete search history.

(56) References Cited

U.S. PATENT DOCUMENTS

| | | | | |
|---|---|---|---|---|
| 5,615,477 A | * | 4/1997 | Sweitzer | .................. 29/840 |
| 5,643,831 A | * | 7/1997 | Ochiai et al. | ................ 438/616 |
| 6,276,599 B1 | * | 8/2001 | Ogawa | ........................ 228/254 |
| 6,329,631 B1 | * | 12/2001 | Yueh | ...................... 219/121.65 |
| 6,457,633 B1 | * | 10/2002 | Takashima et al. | ........ 228/248.1 |
| 7,134,198 B2 | * | 11/2006 | Nakatani et al. | ............... 29/841 |
| 2002/0017855 A1 | * | 2/2002 | Cooper et al. | ................ 313/495 |
| 2006/0027632 A1 | * | 2/2006 | Akram | .................. 228/180.22 |

FOREIGN PATENT DOCUMENTS

JP        2004228135 A  *  8/2004

OTHER PUBLICATIONS

Machine translation of JP-2004228135A.*

* cited by examiner

*Primary Examiner*—Kiley Stoner

(57) ABSTRACT

A method for manufacturing electrical connections in wafer is provided. A plurality of openings is formed on the upper surface of a wafer by dry etching or laser drilling and then solder paste is applied to the openings. Next, the wafer is positioned in a vacuum environment and is heated to soften the solder paste. Subsequently, the vacuum is suddenly broken to have the pressure upon the upper surface of the wafer greater than that in the openings thereby pressing the molten solder paste into the openings.

11 Claims, 4 Drawing Sheets

METHOD FOR MANUFACTURING ELECTRIC CONNECTIONS IN WAFER

CROSS REFERENCE TO RELATED APPLICATION

This application claims the priority benefit of Taiwan Patent Application Serial Number 096109644 filed Mar. 21, 2007, the full disclosure of which is incorporated herein by reference.

BACKGROUND OF THE INVENTION

1. Field of the Invention

The invention relates to a method for manufacturing electrical connections in a wafer, and more particularly, to a method that uses air pressure to press molten solder paste into openings for manufacturing electrical connections in a wafer.

2. Description of the Related Art

As electronic products are getting smaller and lighter, the packages for protecting and interconnecting IC chips also have the same trend.

With ever-increasing demands for miniaturization and higher operating speeds, multi-chip packages have become an attractive approach in a variety of electronic device. Multi-chip packages, which contain two or more chips in a single package, can help minimize the limitation in system operation speed. In addition, multi-chip packages are capable of decreasing the interconnection length between IC chips thereby reducing signal delays and access times.

Referring to FIGS. 1 and 2, a conventional stacked chip package 100 includes a substrate 110 and a chip 120 disposed on the substrate 110. The chip 120 is electrically connected to the substrate 110 by a plurality of bumps 140. Another chip 130 is stacked on the chip 120 and electrically connected to the chip 120 by a plurality of bumps 150. In order to have the chip 130 electrically connected to the substrate 110 through the chip 120, a plurality of through holes 126 is formed on the active surface 122 of the chip 120 through to the back surface 124 of the chip 120. The through holes 126 are filled with conductors 128 to electrically connect the bumps 150 to the bumps 140 respectively so that the chip 130 can be electrically connected to the substrate 110.

In general, the through holes in a chip are typically formed by dry etching or laser drilling and the walls of the through holes are electroplated with copper to form plated through holes. However, when the through hole has a high aspect ratio, it is required to carefully control electric current density in the electroplating process in order to obtain satisfactory electroplating results. For example, referring to FIG. 3, when the walls of the hole 310 in a chip 300 are electroplated with a layer of copper, it is very common that a great deal of copper is deposited on the upper edge of the hole 310 to form a so-called "overhang" 330 as a result of point discharge. The overhang 330 will prevent the copper from being further deposited on the walls of the hole 310, especially frequently occurring in a hole with an aspect ratio of greater than 4.

Accordingly, there exists a need to provide a method for manufacturing electrical connections in a wafer to solve the above-mentioned problems.

SUMMARY OF THE INVENTION

It is an object of the present invention to provide a method that uses air pressure to press molten solder paste into openings for manufacturing electrical connections in a wafer thereby avoiding the prior-art overhang problem resulted from electroplating.

In order to achieve the above object, the method for manufacturing electrical connections in a wafer according to the present invention is to form a plurality of openings on the upper surface of a wafer by dry etching or laser drilling. Next, solder paste is applied on the openings by screen printing. Subsequently, the solder paste is heated to melt and the wafer is positioned in a vacuum environment. Finally, the vacuum environment is broken to have the pressure exerted on the upper portions of the molten solder paste greater than the pressure exerted on the lower portions of the molten solder paste thereby pressing the molten solder paste into the openings.

According to the method of the present invention, the formation of pressure difference causes the molten solder paste to be pressed into the openings to form electrical connections in a wafer. This will avoid the prior-art overhang problem resulted from electroplating.

The foregoing, as well as additional objects, features and advantages of the invention will be more readily apparent from the following detailed description, which proceeds with reference to the accompanying drawings.

DETAILED DESCRIPTION OF THE PREFERRED EMBODIMENT

Figure 1:
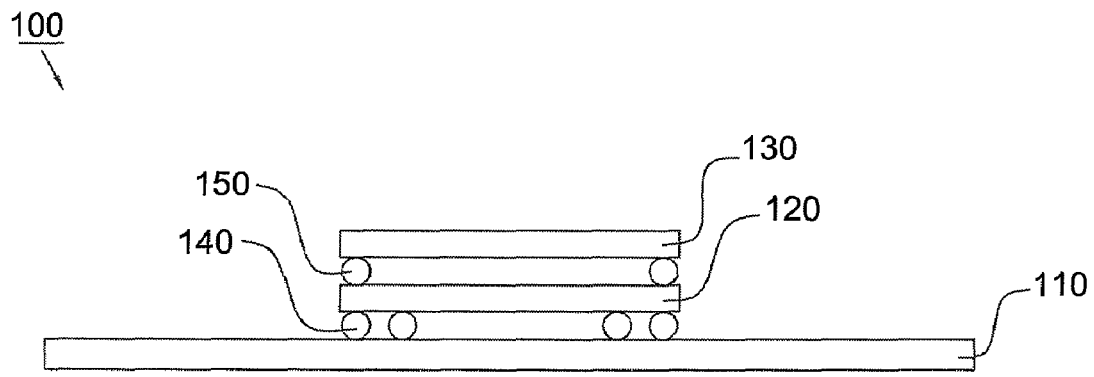
FIG. 1 is a cross-sectional view of a conventional stack package.
Figure 2:
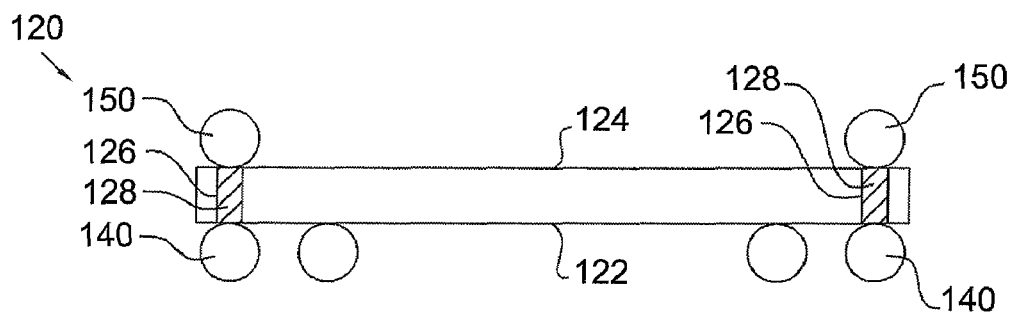
FIG. 2 is an enlarged view of the lower chip of FIG. 1.
Figure 3:
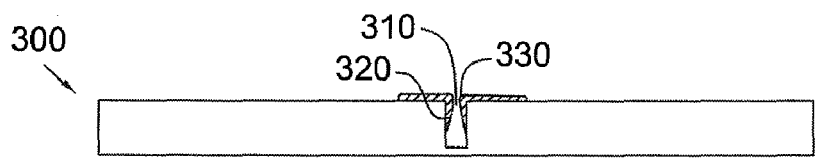
FIG. 3 illustrates that the walls of an opening on a chip are electroplated with a layer of copper.
Figure 4A:
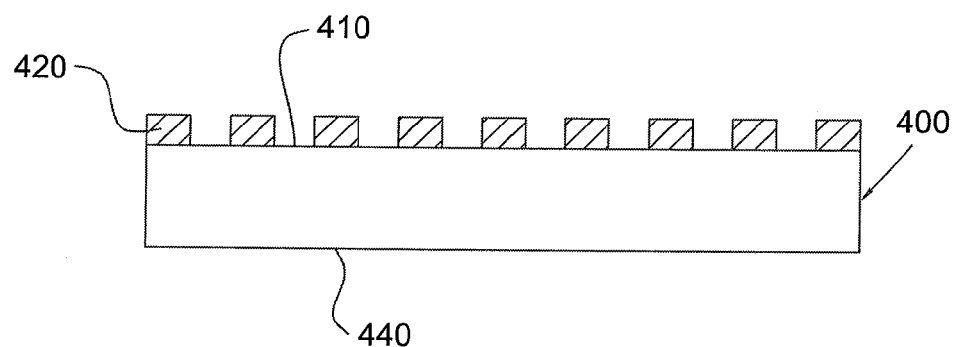
FIGS. 4a to 4f illustrate the method for manufacturing electrical connections in a wafer according to the present invention.
Figure 4B:
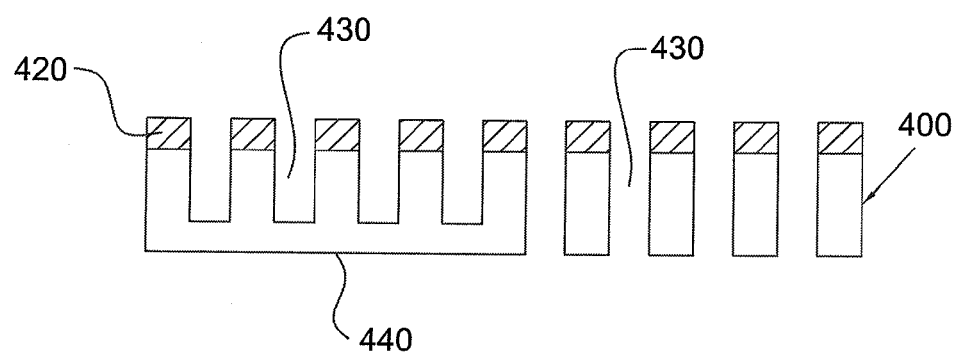
Figure 4C:
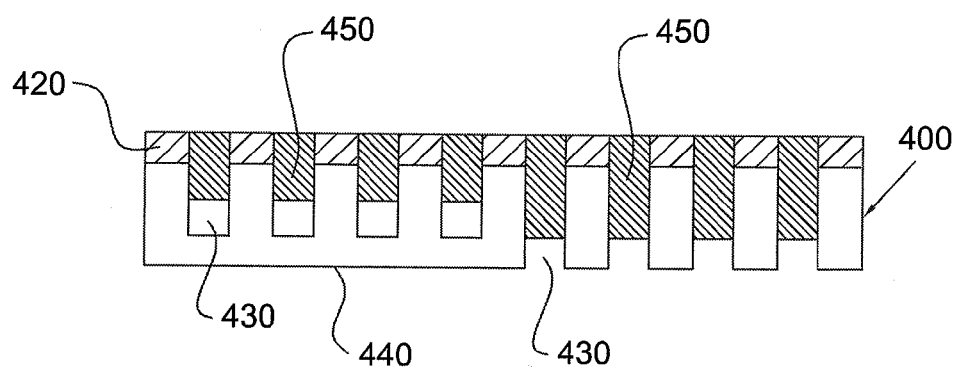
Figure 4D:
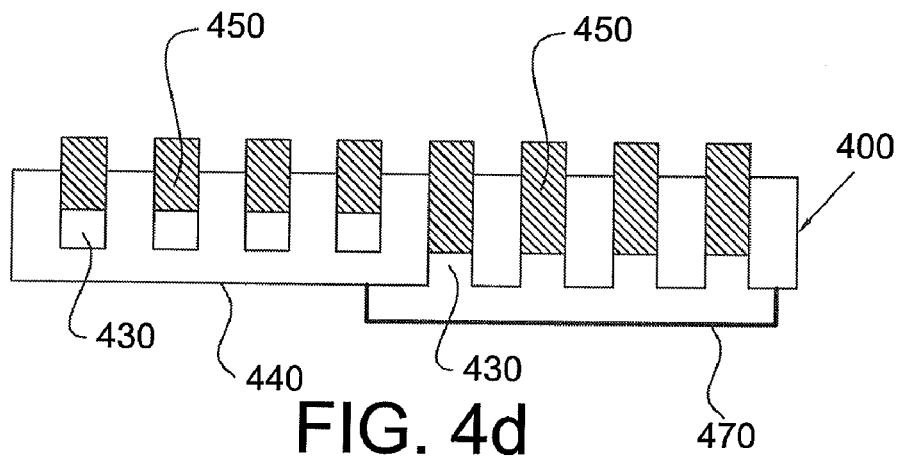

Referring to FIGS. 4a and 4b, the method for manufacturing electrical connections in a wafer according to the present invention is first to form a dry film pattern 420 on the upper surface 410 of a wafer 400 (see FIG. 4a). Referring to FIG. 4b, the wafer 400 is then dry-etched with the pattern 420 as a mask to form a plurality of openings 430 on the upper surface 410. The openings 430 can be blind holes or through holes through to the lower surface 440 of the wafer 400 and have an aspect ratio of greater than 6. Next, referring to FIG. 4c, solder paste 450 is applied on the openings 430 by screen printing. Subsequently, referring to FIG. 4d, the dry film pattern 420 is removed. Alternatively, the openings 430 can be formed by laser drilling. In this way, there is no need to form the dry film pattern 420 on the upper surface 410 of the wafer 400.

Figure 4E:
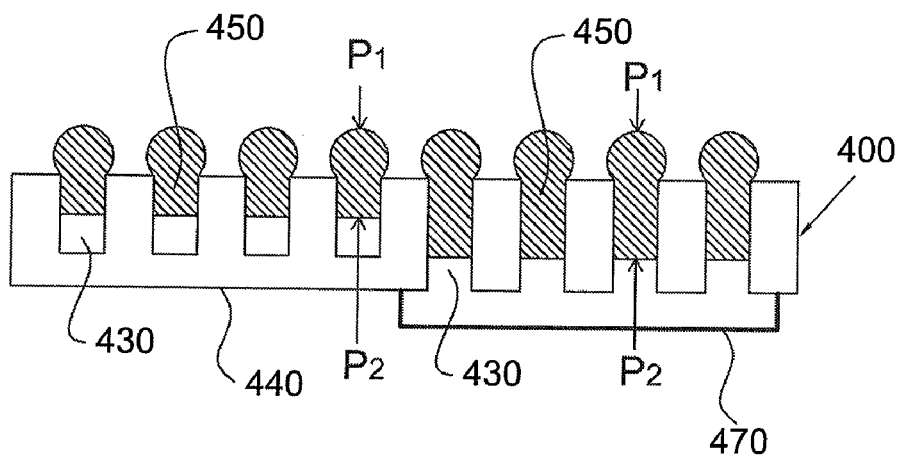
Figure 4F:
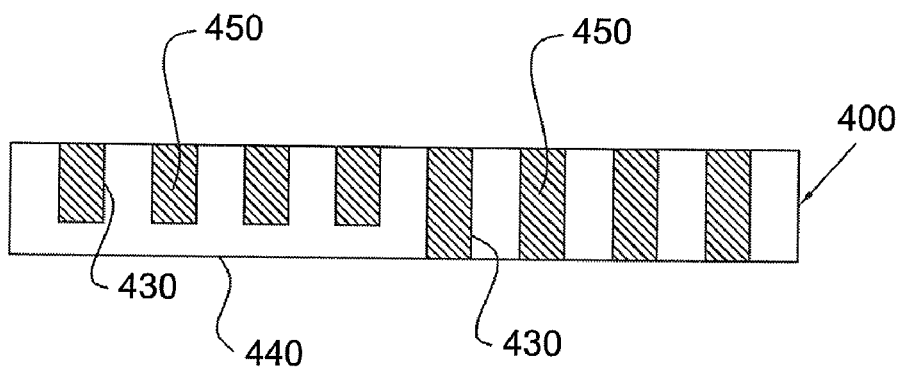

Referring to FIG. 4e, in order to press the solder paste 450 into the opening 430, the solder paste 450 is heated to melt and the wafer 400 is positioned in an environment that the air pressure $P_1$ upon the upper surface 410 of the wafer 400 is greater than the air pressure $P_2$ in the openings 430. Such difference of pressure will force the molten solder paste 450 to be pressed into the openings 430 thereby forming electrical connections in the wafer 400 (see FIG. 4f).

According to the preferred embodiment of the present invention, the wafer 400 is positioned in a vacuum environment, such as an empty vacuum chamber. The solder paste 450 applied on the opening 430 is heated to melt. Subsequently, the vacuum environment is broken suddenly, i.e. the empty vacuum chamber filled with a lot of air in a very short time. At this moment the upper portions of the molten solder paste 450 will be exerted the pressure $P_1$ while the lower portions of the molten solder paste 450 will be exerted the pressure $P_2$ that is smaller than the pressure $P_1$. As a result, the molten solder paste 450 will be pressed into the openings 430.

Figure 5:
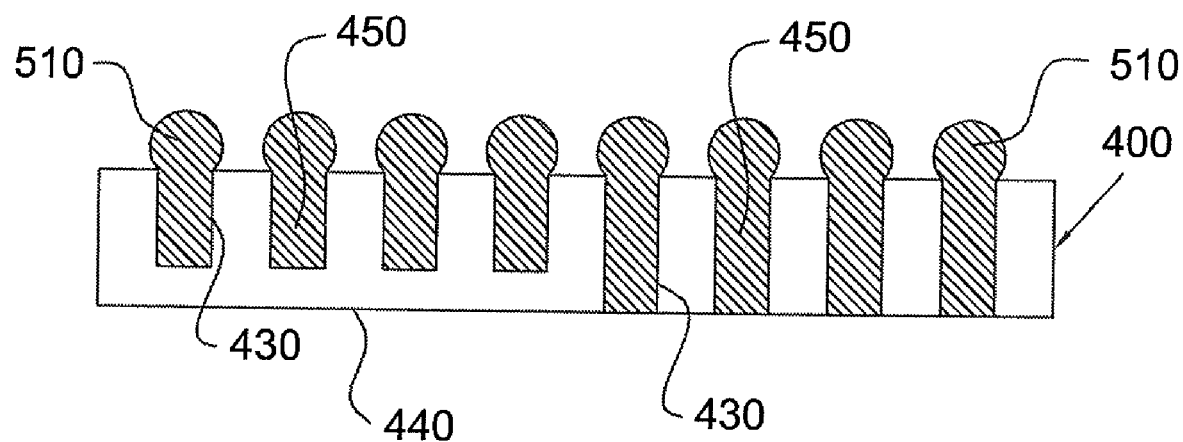
FIG. 5 illustrates the bumps are integrally formed with the solder in the openings of the wafer according to the method of present invention.

It is to be noted that when the openings 430 are through holes through to the lower surface 440 of the wafer 400, the pressure $P_1$ exerting on the upper portions of the molten solder paste 450 will be equal to the pressure $P_2$ exerting on the lower portions of the molten solder paste 450. Consequently, the molten solder paste 450 will not be pressed into the through holes 430. To solve this problem, a cover 470 can be airtightly attached to the lower surface 440 of the wafer 400 so that the pressure $P_2$ exerting on the lower portions of the molten solder paste 450 will be smaller than the pressure $P_1$ exerting on the upper portions of the molten solder paste 450 at the breaking-vacuum moment. In this way, the molten solder paste 450 can be pressed into the through holes 430. In addition, a molten solder paste will have a ball shape as a result of cohesion. Therefore, referring to FIG. 5, the amount of the solder paste 450 can be appropriately adjusted so that the solder paste 450 can fill with the openings 430 and form ball-shaped bumps 510 on the filled openings 430. Specifically, the bumps 510 can be integrally formed with the solder 450 in the openings 430 of the wafer 400. In this way, there is no need to perform an additional ball mount process in order to form bumps on the filled openings 430. Moreover, the method of the present invention can be used to manufacture electrical connections in a dummy wafer or a wafer with circuitry thereon. Such wafers can be singulated to form individual dummy chips or chips with functions, respectively.

According to the method of the present invention, the formation of pressure difference causes the molten solder paste to be pressed into the openings to form electrical connections in a wafer. This will avoid the prior-art overhang problem resulted from electroplating.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A method of manufacturing electrical connections in a wafer that has opposing upper and lower surfaces, said method comprising the steps of:
    forming a plurality of though openings on the upper surface of the wafer, the through openings extending though the wafer from the upper surface to the lower surface;
    airtightly attaching a cover to the lower surface of the wafer;
    applying solder paste on the openings;
    heating to melt the solder paste; and
    exerting a first air pressure on upper portions of the molten solder paste and a second air pressure on lower portions of the molten solder paste, wherein the first air pressure is greater than the second air pressure to press the molten solder paste into the through openings to form the electrical connections in the wafer.

2. The method as claimed in claim 1, wherein the step of exerting the first air pressure greater than the second air pressure comprises:
    positioning the wafer in a vacuum environment before the solder paste is applied on the openings; and
    breaking the vacuum environment when the solder paste is molten.

3. The method as claimed in claim 1, wherein the openings are formed by laser drilling.

4. The method as claimed in claim 1, wherein the openings are formed by dry etching, the method further comprises:
    forming a dry film pattern on the upper surface of the wafer before the openings are formed; and
    removing the dry film pattern after the openings are formed.

5. The method as claimed in claim 1, further comprising:
    adjusting the amount of the solder paste applied on the openings so that the molten solder paste not only fills the openings as a result of said exerting but also forms a plurality of bumps on the filled openings.

6. The method as claimed in claim 1, wherein the solder paste is applied on the openings by screen printing.

7. The method as claimed in claim 1, wherein the openings have an aspect ratio of greater than 6.

8. The method as claimed in claim 5, wherein:
    the molten solder paste completely fills the openings as a result of said exerting.

9. The method as claimed in claim 8, wherein the step of exerting the first air pressure greater than the second air pressure comprises:
    positioning the wafer in a vacuum environment before the solder paste is applied on the openings; and
    breaking the vacuum environment when the solder paste is molten.

10. A method of manufacturing electrical connections in a wafer that has opposing upper and lower surfaces, said method comprising the steps of:
    forming a plurality of openings on the upper surface of the wafer, wherein the openings are through openings that extend through the wafer from the upper surface to the lower surface;
    applying solder paste on the openings;
    heating to melt the solder paste; and
    exerting a first air pressure on upper portions of the molten solder paste and a second air pressure on lower portions of the molten solder paste, wherein the first air pressure is greater than the second air pressure to press the molten solder paste into the openings to form the electrical connections in the wafer;
    said method further comprising:
    adjusting the amount of the solder paste applied on the openings so that the molten solder paste not only fills the openings as a result of said exerting but also forms a plurality of bumps on the filled openings;
    wherein the molten solder paste completely fills the openings as a result of said exerting; and
    wherein the step of exerting the first air pressure greater than the second air pressure comprises:
        positioning the wafer in a vacuum environment before the solder paste is applied on the openings;
        airtightly attaching a cover to the lower surface of the wafer; and
        breaking the vacuum environment when the solder paste is molten and after the cover has been airtightly attached to the lower surface of the wafer.

11. A method of manufacturing electrical connections in a wafer that has opposing upper and lower surfaces, said method comprising the steps of:
    forming a plurality of openings on the upper surface of the wafer;

applying solder paste on the openings;
heating to melt the solder paste; and
exerting a first air pressure on upper portions of the molten solder paste and a second air pressure on lower portions of the molten solder paste, wherein the first air pressure is greater than the second air pressure to press the molten solder paste into the openings to form the electrical connections in the wafer;

wherein:
the steps are performed in the recited order;
the solder paste partially fills the openings as a result of said applying; and
the molten solder paste completely fills the openings as a result of said exerting.

* * * * *